(12) United States Patent
Mohapatra et al.

(10) Patent No.: US 9,733,331 B2
(45) Date of Patent: Aug. 15, 2017

(54) METHOD OF MANUFACTURING TOUCH SENSORS

(71) Applicant: Apple Inc., Cupertino, CA (US)

(72) Inventors: Siddharth Mohapatra, Santa Clara, CA (US); Sunggu Kang, San Jose, CA (US); John Z. Zhong, Cupertino, CA (US); Albert Lin, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1008 days.

(21) Appl. No.: 13/710,233

(22) Filed: Dec. 10, 2012

(65) Prior Publication Data

US 2014/0070824 A1 Mar. 13, 2014

Related U.S. Application Data

(60) Provisional application No. 61/699,147, filed on Sep. 10, 2012.

(51) Int. Cl.
*G06F 3/044* (2006.01)
*G01R 35/00* (2006.01)
(Continued)

(52) U.S. Cl.
CPC .......... *G01R 35/00* (2013.01); *G06F 3/044* (2013.01); *H05K 3/0097* (2013.01); *H05K 3/02* (2013.01);
(Continued)

(58) Field of Classification Search
CPC .......... G06F 3/044; G06F 2203/04103; H05K 3/0097; H05K 3/02; Y10T 29/49204; Y10T 29/49124
See application file for complete search history.

(56) References Cited

U.S. PATENT DOCUMENTS 5,483,261 A 1/1996 Yasutake
5,488,204 A 1/1996 Mead et al.
(Continued)

FOREIGN PATENT DOCUMENTS

JP 2000-163031 A 6/2000
JP 2002-342033 A 11/2002

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
(Continued)

*Primary Examiner* — Peter DungBa Vo
*Assistant Examiner* — Jeffrey T Carley
(74) *Attorney, Agent, or Firm* — Morrison & Foerster, LLP

(57) ABSTRACT

Roll-to-roll processes for manufacturing touch sensors on a plastic base film are provided. The touch sensors can be deposited on the base film using various patterning techniques. One or more shorting bars can also be patterned onto the base film to couple together traces, such as drive lines, sense lines, conductive traces, and the like, of the touch sensor to prevent a potential difference from forming between traces due to static buildup during the manufacturing process. After the touch sensor is fully formed on the base film, the touch sensor can be removed from the base film using lithography or a physical cutting process. The removal process can separate the touch sensor from the one or more shorting bars, thereby uncoupling the traces of the touch sensor.

12 Claims, 15 Drawing Sheets

(51) Int. Cl.
*H05K 3/00* (2006.01)
*H05K 3/02* (2006.01)

(52) U.S. Cl.
CPC .............. *G06F 2203/04103* (2013.01); *Y10T 29/49117* (2015.01); *Y10T 29/49124* (2015.01); *Y10T 29/49204* (2015.01); *Y10T 29/49815* (2015.01)

(56) References Cited

U.S. PATENT DOCUMENTS

| | | | |
|---|---|---|---|
| 5,684,546 A * | 11/1997 | Kim | G02F 1/136204 349/139 |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,358,767 B2 | 3/2002 | Eguchi | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,217,591 B2 | 5/2007 | Huang | |
| 7,663,607 B2 | 2/2010 | Hotelling et al. | |
| 7,903,187 B2 | 3/2011 | Shin et al. | |
| 8,479,122 B2 | 7/2013 | Hotelling et al. | |
| 2006/0026521 A1 | 2/2006 | Hotelling et al. | |
| 2006/0197753 A1 | 9/2006 | Hotelling | |
| 2009/0090694 A1* | 4/2009 | Hotelling | G06F 3/044 216/41 |
| 2011/0006999 A1* | 1/2011 | Chang | G06F 3/044 345/173 |
| 2013/0063393 A1* | 3/2013 | Kurishima | B32B 7/02 345/174 |

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner personal device 1500 personal device 1400 personal
device
1700 personal
device
1600

METHOD OF MANUFACTURING TOUCH SENSORS

FIELD

This relates generally to touch sensors and, more specifically, to roll-to-roll processes for manufacturing touch sensors.

BACKGROUND

Many types of input devices are presently available for performing operations in a computing system, such as buttons or keys, mice, trackballs, joysticks, touch sensor panels, touch screens, and the like. Touch sensitive devices, such as touch screens, in particular, are becoming increasingly popular because of their ease and versatility of operation. A touch sensitive device can include a touch sensor panel, which can be a clear panel with a touch-sensitive surface, and a display device, such as a liquid crystal display (LCD) or organic light emitting diode (OLED) display, that can be positioned partially or fully behind the panel so that the touch-sensitive surface can cover at least a portion of the viewable area of the display device. The touch sensitive device can allow a user to perform various functions by touching the touch sensor panel using a finger, stylus, or other object at a location often dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

Many processes have been developed to manufacture these touch sensors. For example, conventional roll-to-roll processes involve patterning electronic devices onto rolls of thin, flexible plastic or metal foil. These devices can then be removed from the roll using lithography or a physical cutting process. These roll-to-roll processes can reduce the amount of time and money required to manufacture touch sensors. However, when using roll-to-roll processes to manufacture a touch sensor onto a flexible plastic material, static electricity can build up, causing short periods of high current in the touch sensor circuitry when the static electricity is discharged. This can damage the conductive traces of the touch sensor, resulting in undesirable open circuits. Thus, improved plastic roll-to-roll processes are desired.

SUMMARY

This relates to roll-to-roll processes for manufacturing touch sensors on a plastic base film. The touch sensors can be deposited on the base film using various patterning techniques. One or more shorting bars can also be patterned onto the base film to couple together traces, such as drive lines, sense lines, conductive traces, and the like, of the touch sensor to prevent a potential difference from forming between traces due to static buildup during the manufacturing process. After the touch sensor is fully formed on the base film, the touch sensor can be removed from the base film using lithography or a physical cutting process. The removal process can separate the touch sensor from the one or more shorting bars, thereby uncoupling the traces of the touch sensor.

DETAILED DESCRIPTION

In the following description of the disclosure and examples, reference is made to the accompanying drawings in which it is shown by way of illustration specific examples that can be practiced. It is to be understood that other examples can be practiced and structural changes can be made without departing from the scope of the disclosure.

This relates to roll-to-roll processes for manufacturing touch sensors on a plastic base film. The touch sensors can be deposited on the base film using various patterning techniques. One or more shorting bars can also be patterned onto the base film to couple together traces, such as drive lines, sense lines, conductive traces, and the like, of the touch sensor to prevent or reduce the amount of potential difference between traces due to static buildup during the manufacturing process. After the touch sensor is fully formed on the base film, the touch sensor can be removed from the base film using lithography or a physical cutting process. The removal process can separate the touch sensor from the one or more shorting bars, thereby uncoupling the traces of the touch sensor.

Figure 1:
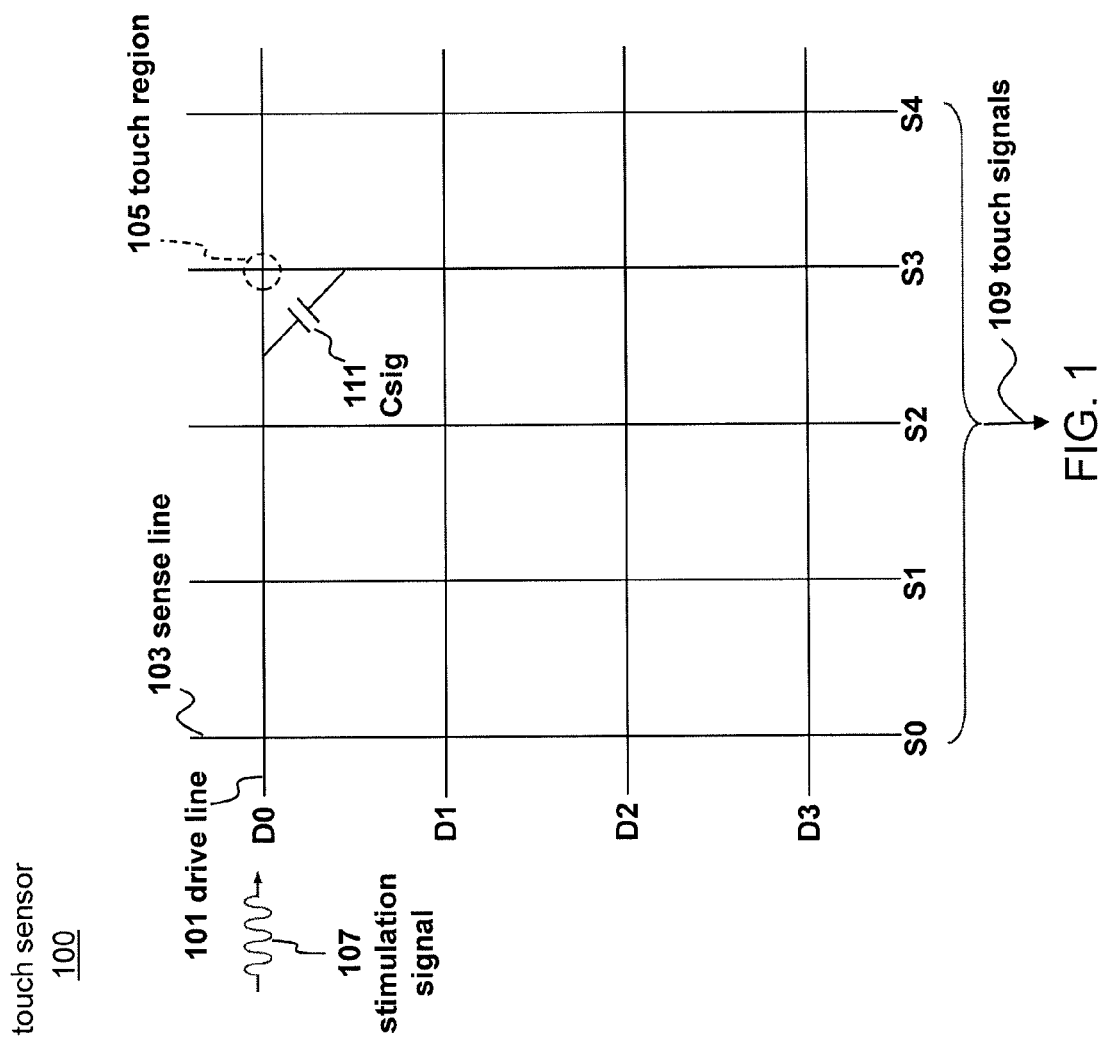
FIG. 1 illustrates an exemplary touch sensor according to various examples.

FIG. 1 illustrates touch sensor 100 that can be used to detect touch events on a touch sensitive device, such as a mobile phone, tablet, touchpad, portable computer, portable media player, or the like. Touch sensor 100 can include an array of touch regions or nodes 105 that can be formed at the crossing points between rows of drive lines 101 (D0-D3) and columns of sense lines 103 (S0-S4). Each touch region 105 can have an associated mutual capacitance Csig 111 formed between the crossing drive lines 101 and sense lines 103 when the drive lines are stimulated. The drive lines 101 can be stimulated by stimulation signals 107 provided by drive circuitry (not shown) and can include an alternating current (AC) waveform. The sense lines 103 can transmit touch signals 109 indicative of a touch at the touch sensor 100 to sense circuitry (not shown), which can include a sense amplifier for each sense line, or a fewer number of sense amplifiers that can be multiplexed to connect to a larger number of sense lines.

To sense a touch at the touch sensor 100, drive lines 101 can be stimulated by the stimulation signals 107 to capacitively couple with the crossing sense lines 103, thereby forming a capacitive path for coupling charge from the drive lines 101 to the sense lines 103. The crossing sense lines 103 can output touch signals 109, representing the coupled charge or current. When an object, such as a stylus, finger, etc., touches the touch sensor 100, the object can cause the capacitance Csig 111 to reduce by an amount ΔCsig at the touch location. This capacitance change ΔCsig can be caused by charge or current from the stimulated drive line 101 being shunted through the touching object to ground rather than being coupled to the crossing sense line 103 at the touch location. The touch signals 109 representative of the capacitance change ΔCsig can be transmitted by the sense lines 103 to the sense circuitry for processing. The touch signals 109 can indicate the touch region where the touch occurred and the amount of touch that occurred at that touch region location.

While the example shown in FIG. 1 includes four drive lines 101 and five sense lines 103, it should be appreciated that touch sensor 100 can include any number of drive lines 101 and any number of sense lines 103 to form the desired number and pattern of touch regions 105. Additionally, while the drive lines 101 and sense lines 103 are shown in FIG. 1 in a crossing configuration, it should be appreciated that other configurations are also possible to form the desired touch region pattern. While FIG. 1 illustrates mutual capacitance touch sensing, other touch sensing technologies may also be used in conjunction with examples of the disclosure, such as self-capacitance touch sensing, resistive touch sensing, projection scan touch sensing, and the like. Furthermore, while various examples describe a sensed touch, it should be appreciated that the touch sensor 100 can also sense a hovering object and generate hover signals therefrom.

Figure 2:
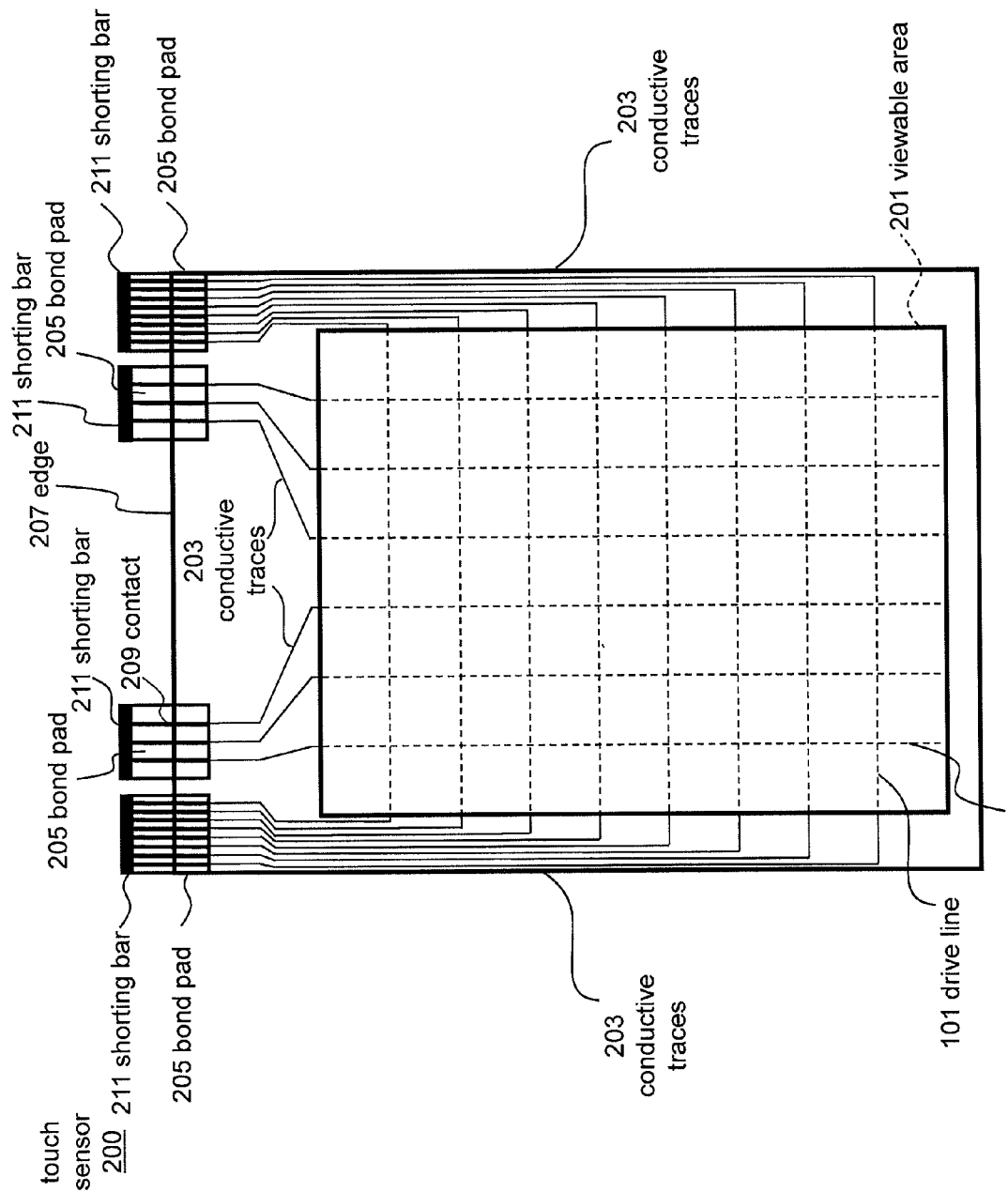
FIG. 2 illustrates a top view of an exemplary touch sensor having shorting bars according to various examples.

FIG. 2 illustrates a top-view of exemplary touch sensor 200 that can be incorporated within a device, such as a touch sensitive phone, portable media player, tablet computer, or the like. For purposes of explanation, drive lines 101 and sense lines 103 (represented by the dashed lines) are shown in the viewable area 201 of touch sensor 200. However, it should be appreciated that drive lines 101 and sense lines 103 can be made from transparent, or at least substantially transparent, materials, such as indium tin oxide (ITO), silicon oxide, other transparent oxides, or the like. As such, drive lines 101 and sense lines 103 may not be visible to the user.

Touch sensor 200 can include conductive traces 203 (represented by the solid lines) for coupling drive lines 101 and sense lines 103 to bond pads 205. Bond pads 205 can be used to couple drive lines 101 and sense lines 103 to circuitry for driving drive lines 101 and circuitry for interpreting touch signals from sense lines 103. In some examples, conductive traces 203 may be made from a non-transparent material, such as copper or other metals.

As discussed above, touch sensors, such as touch sensors 100 and 200, and touch sensitive devices can be manufactured using roll-to-roll processes. However, when using these processes with plastic mother sheets or base films, static charge can build up between traces, such as drive lines 101, sense lines 103, and conductive traces 203. If a sufficient amount of charge is generated, short periods of high current can occur in these traces. This can damage the conductive traces of the touch sensor, resulting in undesirable open circuits.

Figure 3:
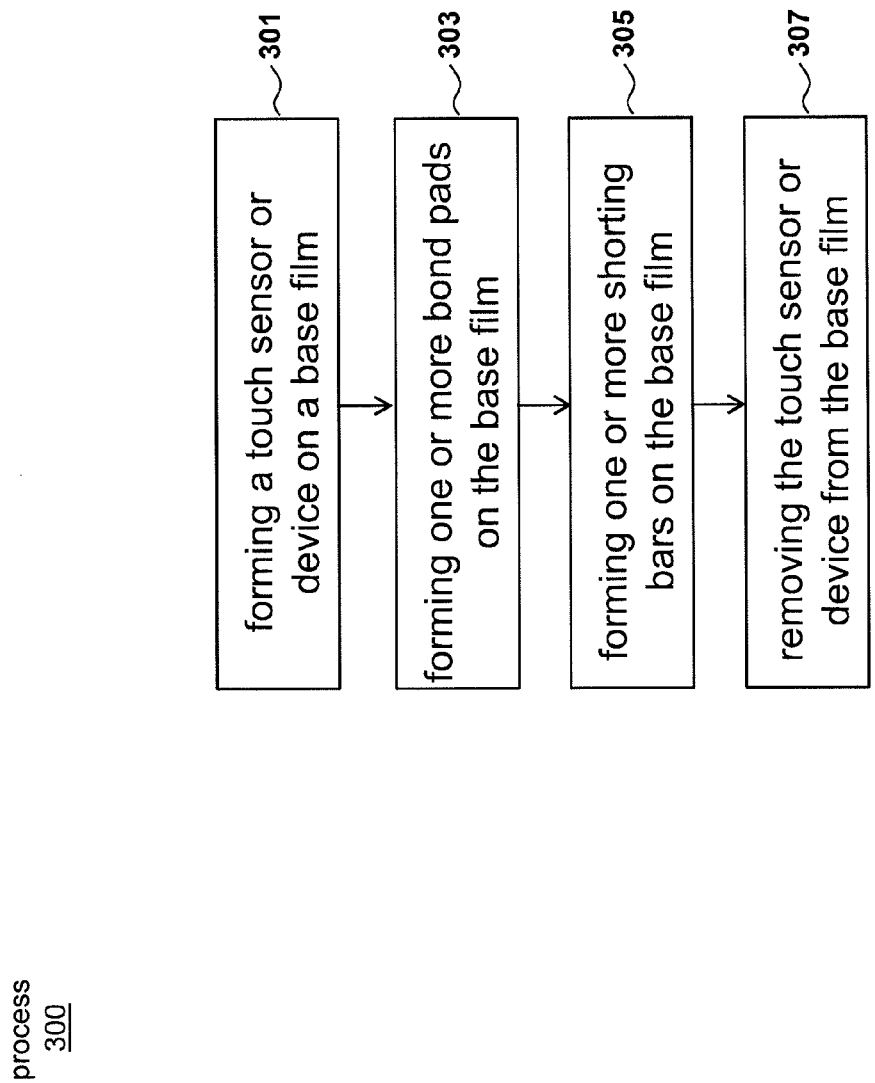
FIG. 3 illustrates an exemplary process for manufacturing a touch sensor having shorting bars according to various examples.

FIG. 3 illustrates an exemplary roll-to-roll process 300 that can be used to manufacture touch sensors, such as touch sensors 100 and 200, and other touch sensitive electronic devices. Process 300 can include the use of a shorting bar to couple together the traces of the touch sensors or touch sensitive devices during the manufacturing process, thereby preventing or reducing the potential difference between traces due to static buildup. Once the manufacturing process is complete, the shorting bar can be separated from the touch sensors or touch sensitive devices.

Figure 4:
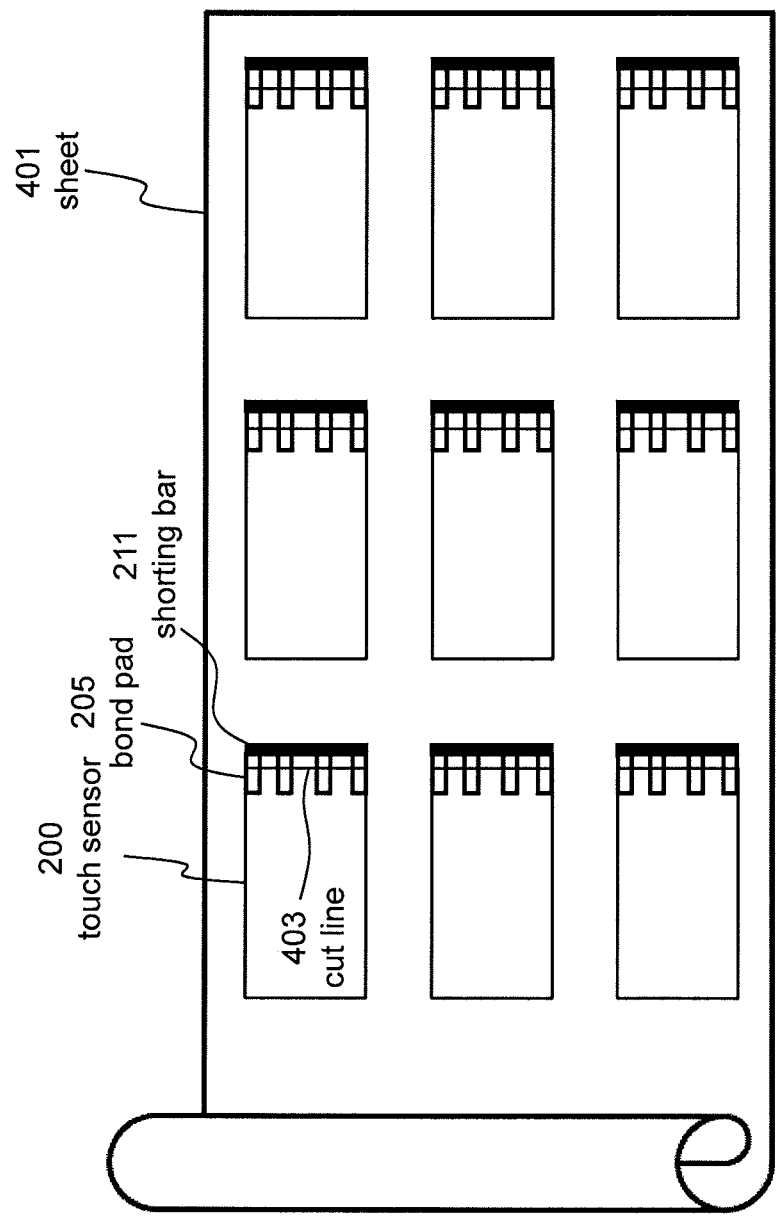
FIG. 4 illustrates an exemplary mother sheet containing multiple touch sensors having shorting bars according to various examples.

At block 301 of process 300, a touch sensor or touch sensitive device can be formed on a base film. To illustrate, FIG. 4 shows multiple touch sensors 200 formed on a sheet of base film 401. In some examples, the sheet of base film 401 can include a flexible plastic material, such as cyclo olefin polymer (COP), and a touch sensor similar or identical to touch sensors 100 or 200 can be formed on the sheet of base film 401 using any known patterning technique, such as deposition or photolithography. As an example, FIGS. 5-12 illustrate the formation of touch sensor 200 on a sheet of COP base film 401 at various stages of manufacture using an exemplary etching process.

Figure 5:
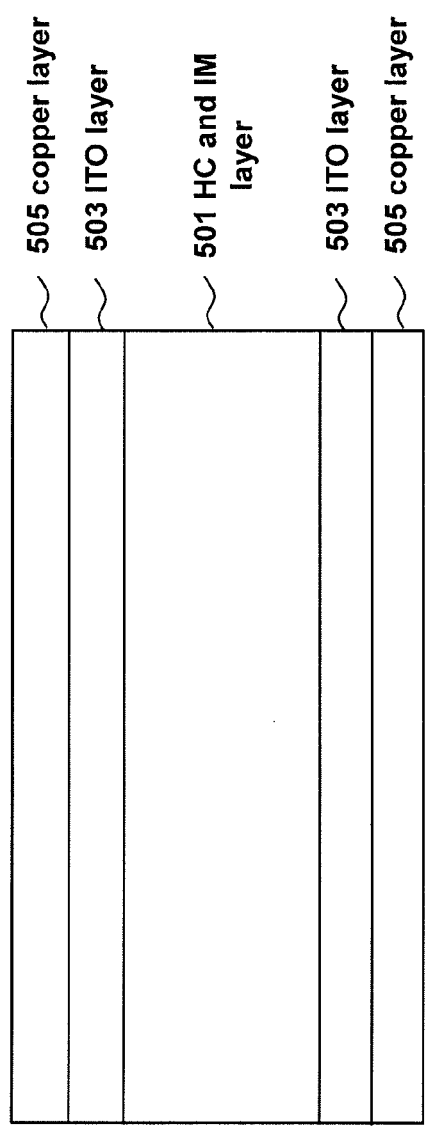
FIGS. 5-12 illustrate a touch sensor at various stages of manufacture according to various examples.
Figure 6:
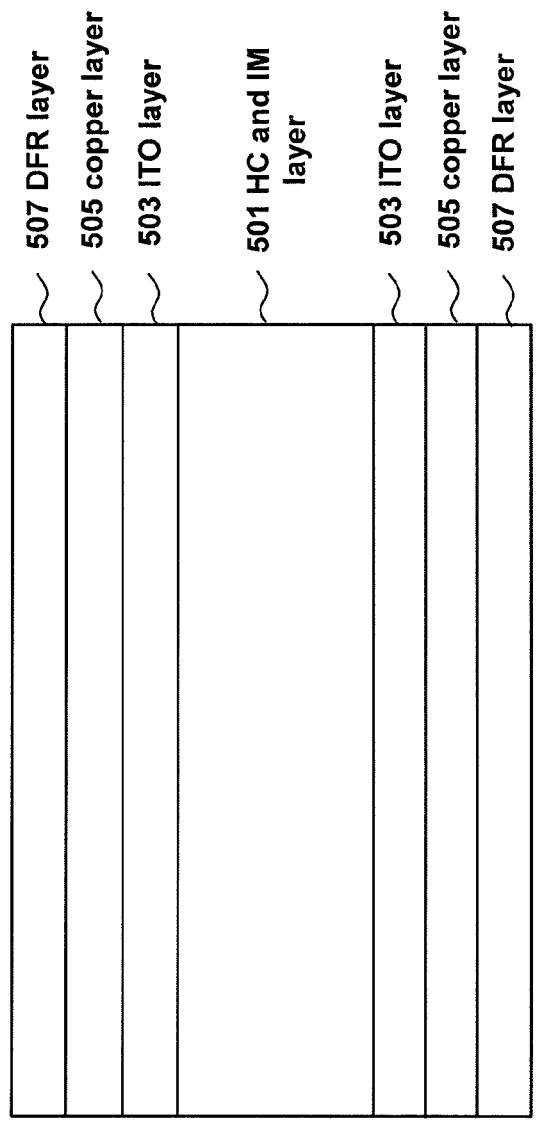
Figure 7:
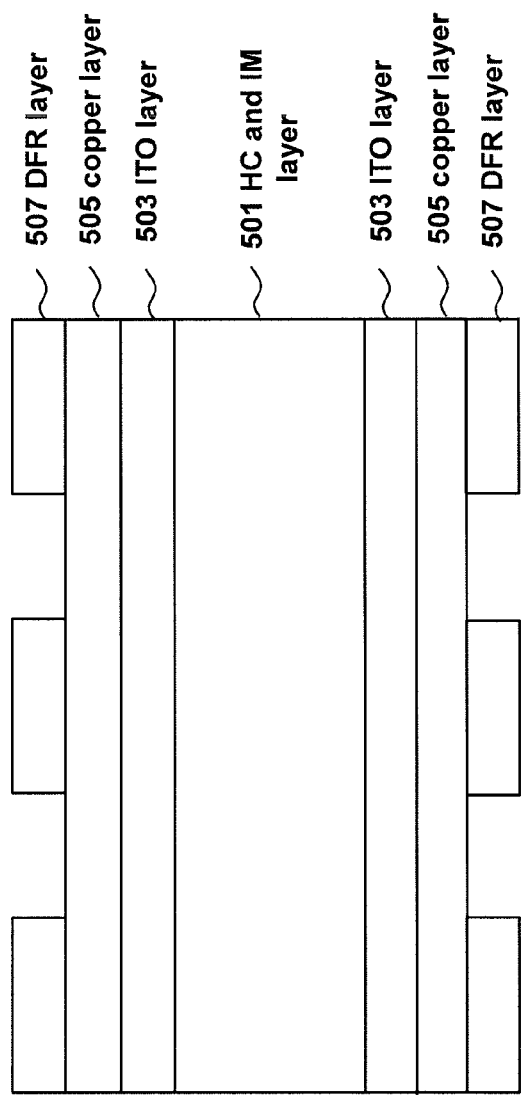
Figure 8:
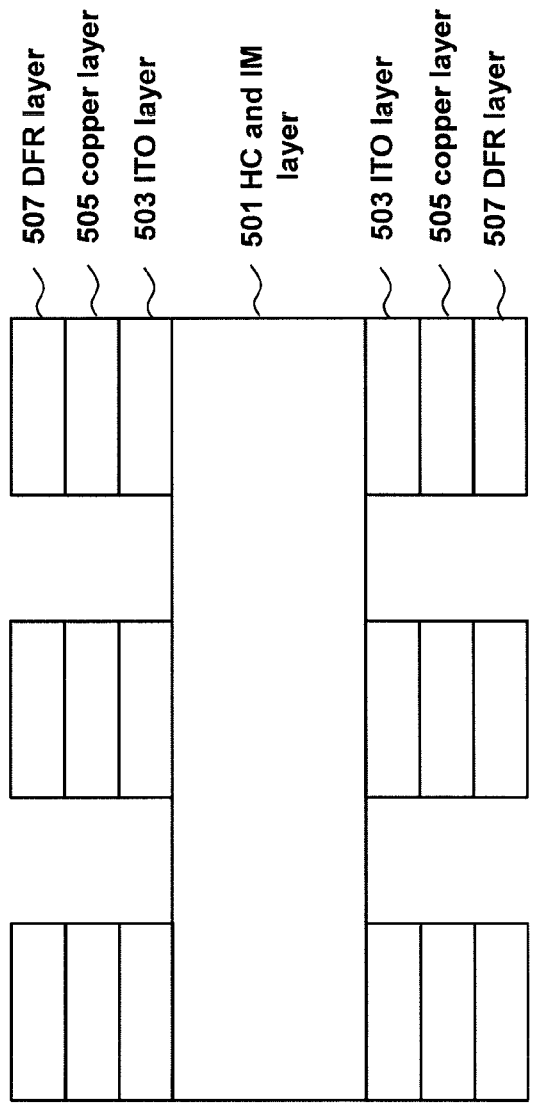
Figure 9:
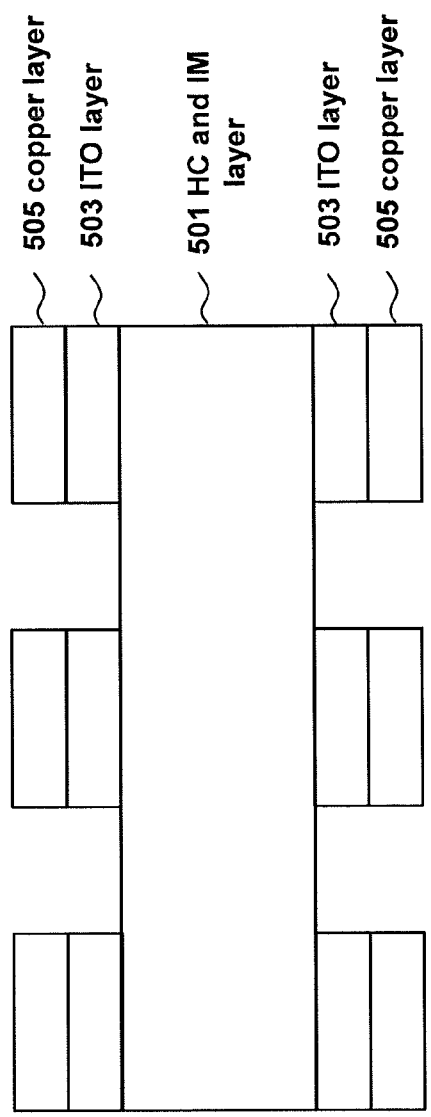
Figure 10:
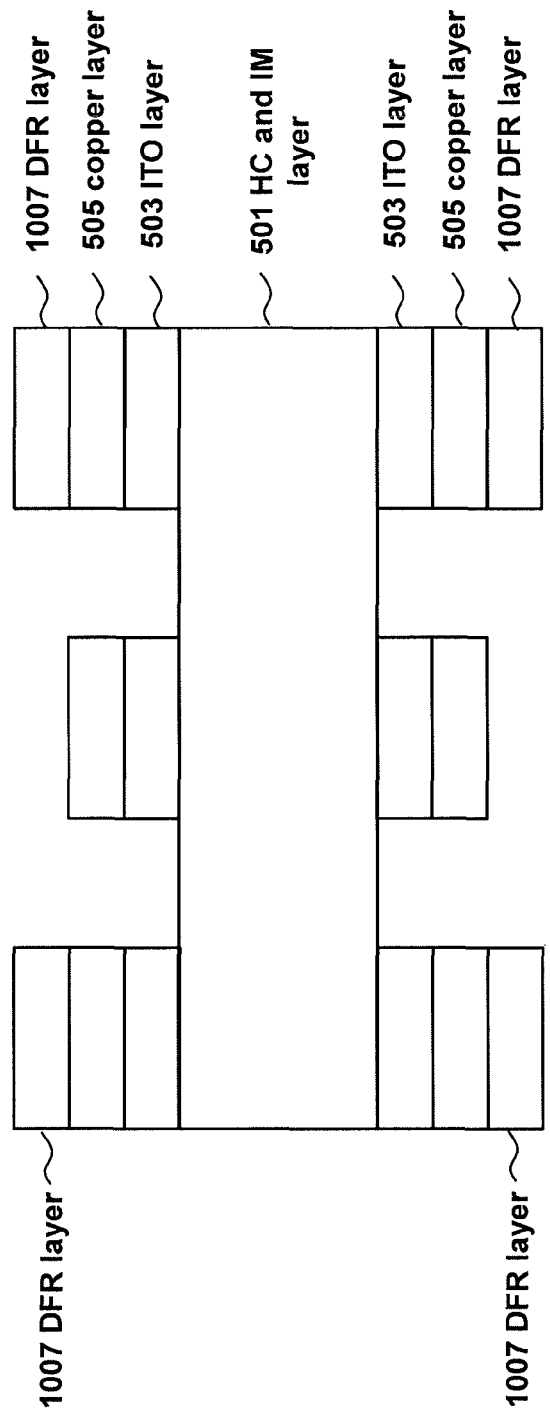
Figure 11:
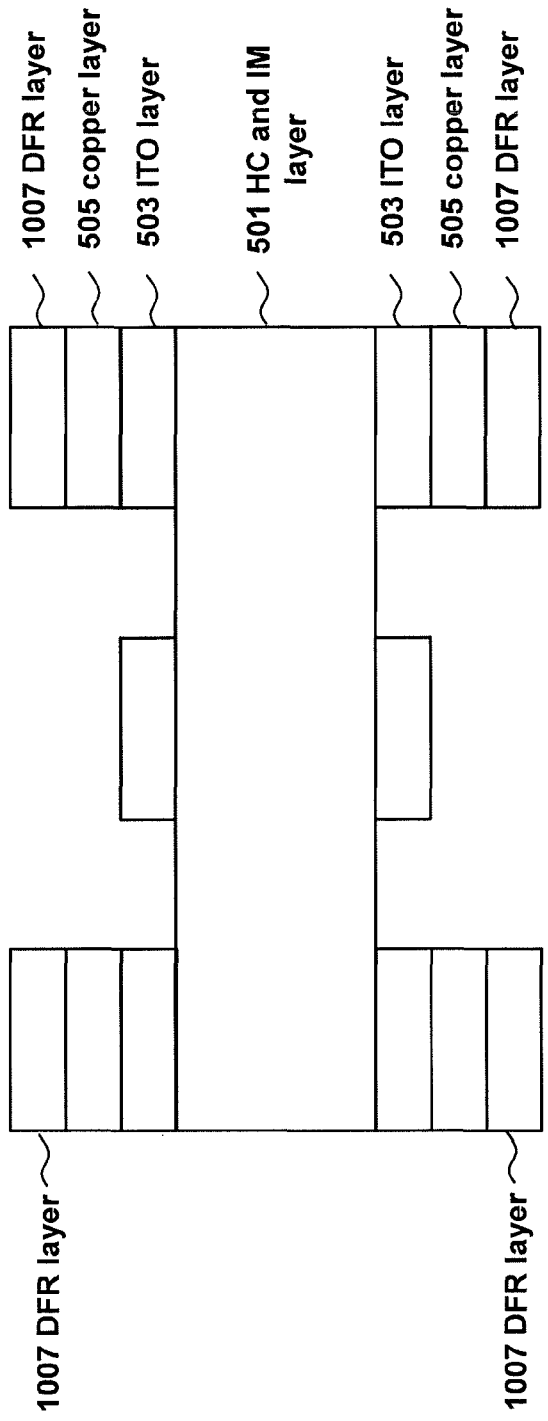
Figure 12:
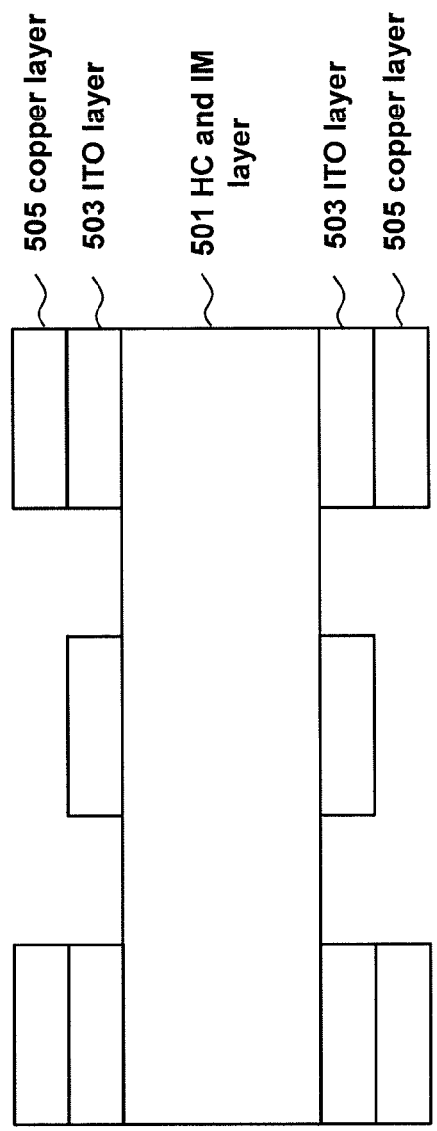

Initially, FIG. 5 illustrates an exemplary sheet of COP base film 401 having a hard-coat (HC) layer, index matching (IM) layer, indium tin oxide (ITO) layer 503, and copper layer 505. The HC layer and IM layer have been combined into a single HC and IM layer 501 for simplicity, but it should be appreciated that these layers can be separate layers. To form touch sensor 200 on the sheet of COP base film 401, a layer of dry film resist (DFR) 507 can be laminated onto the copper layer 505 of the sheet of COP base film 401, as shown in FIG. 6. Portions of the DFR layer 507 can then be etched away to define the conductive traces, drive lines, and sense lines of touch sensor 200, as shown in FIG. 7. For example, portions of DFR layer 507 can be etched away to define drive lines 101, sense lines 103, and conductive traces 203. Specifically, portions of DFR layer 507 above drive lines 101, sense lines 103, and conductive traces 203 can be left intact while the remaining portions of DFR layer 507 can be etched away. Using the remaining DFR layer 507 as a mask, portions of copper layer 505 and ITO layer 503 can be etched using an appropriate etchant, as shown in FIG. 8. The remaining DFR layer 507 can then be etched away, as shown in FIG. 9. A second DFR layer 1007 can then be deposited on portions of sheet 401 corresponding to the conductive traces of the device, as shown in FIG. 10. For example, a second DFR layer 1007 can be deposited onto conductive traces 203 of touch sensor 200. Using the second DFR layer 1007 as a mask, portions of copper layer 505 can be etched away, as shown in FIG. 11. In the example where the second DFR layer 1007 is deposited onto conductive traces 203 of touch sensor 200, the portions of copper layer 505 within viewable area 201 can be removed. The second DFR layer 1007 can then be etched away, leaving the drive lines, sense lines, and conductive traces of touch sensor 200, as shown in FIG. 12. For example, using the example provided above, drive lines 101 formed of ITO, sense lines 103 formed of ITO, and conductive traces 203 formed of copper and ITO can be created using this exemplary etching process.

FIGS. 5-12 show the patterning of both sides of the sheet of COP base film 401. It should be appreciated that different components of the touch sensor can be patterned on each side of the sheet of COP base film 401. For example, the drive lines and associated conductive traces can be patterned on the bottom of the sheet of COP base film 401, while the sense lines and associated conductive traces can be patterned on the top of the sheet of COP base film 401. One of ordinary skill in the art can arrange the components of the touch sensor based on its desired application.

Referring back to process 300 of FIG. 3, after forming the touch sensor on the base film at block 301, the process can proceed to block 303. At block 303, one or more bond pads can be formed on the base film. For example, bond pads similar or identical to bond pads 205 can be formed on a sheet of base film 401 such that they are coupled to conductive traces 203 as shown in FIG. 2. In some examples, the bond pads 205 can extend beyond an edge 207 of touch sensor 200, as shown in FIG. 2. The bond pads can be formed using known patterning techniques, such as deposition or photolithography. In some examples, an etching process similar or identical to that described above with respect to FIGS. 5-12 can be used. In yet other examples, the bond pads can be formed at the same time as the formation of the drive lines, sense lines, and conductive traces at block 301. For instance, the DFR layer 507 can be deposited over an area of sheet 401 corresponding to drive lines 101, sense lines 103, conductive traces 203, and bond pads 205 to prevent etching of the underlying portions of copper layer 505 and ITO layer 503 in these areas. After etching, the first DFR layer 507 can be removed. The second DFR layer 1007 can then be deposited over an area of sheet 401 corresponding conductive traces 203 and bond pads 205 to prevent etching of the underlying portions of copper layer 505 and ITO layer 503 in these areas, resulting in copper conductive traces 203 and bond pads 205. Alternatively, the second DFR layer 1007 can be deposited over an area of sheet 401 corresponding to conductive traces 203 to prevent etching of the underlying portions of copper layer 505 and ITO layer 503 in these areas, resulting in copper conductive traces 203 and ITO bond pads 205. The second DFR layer 1007 can then be removed.

Referring back to process 300 of FIG. 3, after forming the bond pad on the base film at block 303, the process can proceed to block 305. At block 305, one or more shorting bars can be formed on the base film. The shorting bars can include copper or ITO and can couple together contacts of the bond pads formed at block 303. For example, bond pads 205 include contacts 209 corresponding to each coupled drive line 101 or sense line 103. A shorting bar 211 can be formed on a sheet of base film 401 such that they couple together two or more contacts 209 of bond pads 205, as shown in FIG. 2. While shorting bars 211 are shown coupling together all contacts 209 within their respective bond pads 205, it should be appreciated that other configurations are possible. For example, a single shorting bar 211 can be used to couple together all contacts 209 of all bond pads 205. In other examples, a first shorting bar 211 can be used to couple together all contacts 209 that are coupled to drive lines 101 and a second shorting bar 211 can be used to coupled together all contacts 209 that are coupled to sense lines 103. In yet other examples, shorting bars 211 can couple together less than all contacts 209 within a single bond pad 205.

The shorting bars can be formed using known patterning techniques, such as deposition or photolithography. In some examples, an etching process similar or identical to that described above with respect to FIGS. 5-12 can be used. In yet other examples, the shorting bars can be formed at the same time as formation of the drive lines, sense lines, and conductive traces at block 301 and/or the formation of the bond pads at block 303. For instance, the DFR layer 507 can be deposited over an area of sheet 401 corresponding to drive lines 101, sense lines 103, conductive traces 203, bond pads 205, and shorting bars 211 to prevent etching of the underlying portions of copper layer 505 and ITO layer 503 in these areas. After etching, the first DFR layer 507 can be removed. The second DFR layer 1007 can then be deposited over an area of sheet 401 corresponding conductive traces 203, bond pads 205, and shorting bars 211 to prevent etching of the underlying portions of copper layer 505 and ITO layer 503 in these areas, resulting in copper conductive traces 203, bond pads 205, and shorting bars 211. Alternatively, the second DFR layer 1007 can be deposited over an area of sheet 401 corresponding to conductive traces 203 and bond pad 205 to prevent etching of the underlying portions of copper layer 505 and ITO layer 503 in these areas, resulting in copper conductive traces 203, copper bond pads 205, and ITO shorting bars 211. The second DFR layer 1007 can then be removed.

Referring back to process 300 of FIG. 3, after forming the shorting bar on the base film at block 305, the process can proceed to block 307. At block 307, the touch sensor can be removed from the base film. In some examples, the touch sensor can be removed from the base film using lithography or a physical cutting process, such as a die cutting or laser cutting. For example, touch sensors 101 can be separated from sheet 401 in FIG. 4 by cutting along cut line 403. In this way, cut line 403 can define the device area of touch sensor 200. When removing the touch sensor from the base film at block 307, the shorting bar and, in some examples, a portion of the bond pad may be separated from the touch sensor. For example, to remove touch sensor 200 from the sheet of base film 401 shown in FIG. 4, a cut can be made along cut line 403, thereby separating touch sensor 200 from shorting bar 211 and a portion of bond pads 205. In other examples, only shorting bars 211 may be separated from touch sensor 200 at block 307. In either case, separation of shorting bar 211 from touch sensor 200 uncouples the contacts 209 that were previously coupled together by shorting bars 211.

Coupling together contacts 209 of bond pads 205 using one or more shorting bars 211 advantageously prevents or reduces the amount of potential difference that can be generated between traces due to static buildup. Moreover, the shorting bars 211 provide an access point to quickly test touch sensors 100 or 200 during manufacture. For example, probes can be attached to shorting bars 211 coupled to the outer bond pads 205 of touch sensor 200 to measure the impedance of the aggregate of drive lines 101 and associated conductive traces 203. If the impedance falls outside an expected range of values, it can quickly be determined if a defect has occurred in the drive lines 101 and associated conductive traces 203. Similarly, the probes can be attached to the shorting bars 211 coupled to the inner bond pads 205 of touch sensor 200 to determine if a defect has occurred in the sense lines 103 and associated conductive traces 203. It should be appreciated that other configurations of shorting bar 211 are possible and that these configurations can be designed to reduce a potential buildup between selected traces and to allow testing of groups of drive lines 101 and sense lines 103.

Figure 13:
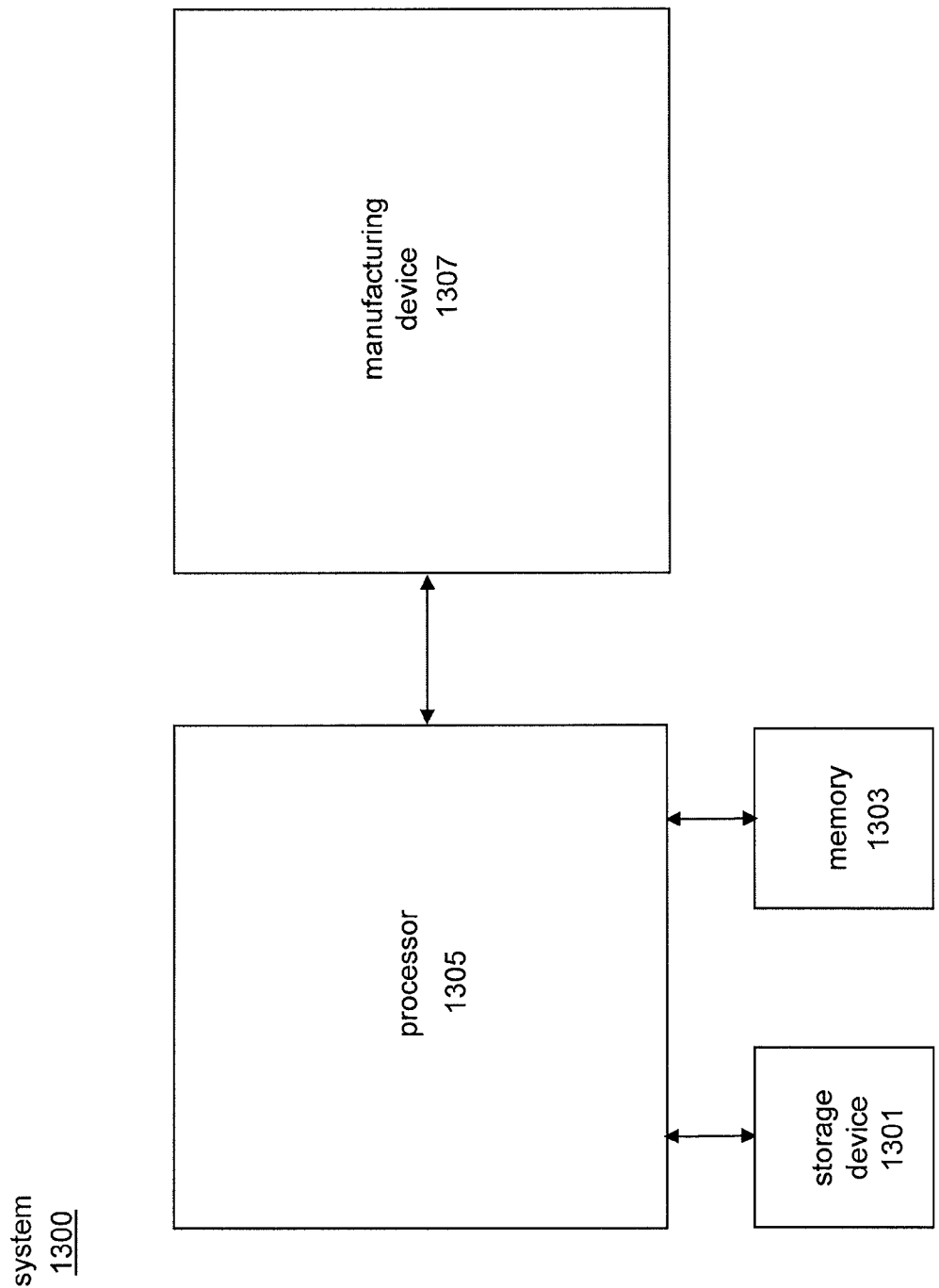
FIG. 13 illustrates an exemplary system for manufacturing a touch sensor having shorting bars according to various examples.

One or more of the functions relating to the manufacturing of a touch sensitive device having a shorting bar can be performed by a system similar or identical to system 1300 shown in FIG. 13. System 1300 can include instructions stored in a non-transitory computer readable storage medium, such as memory 1303 or storage device 1301, and executed by processor 1305. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

System 1300 can further include manufacturing device 1307 coupled to processor 1305. Manufacturing device 1307 can be operable to form a touch sensor or other electronic device on a base film and remove the touch sensor or electronic device from the base film, as discussed above with respect to FIG. 3. Processor 1305 can control manufacturing device 1307 and its components to generate a desired pattern of conductive traces, drive lines, sense lines, bond pads, and shorting bars in a manner similar or identical to that described above with respect to process 300.

It is to be understood that the system is not limited to the components and configuration of FIG. 13, but can include other or additional components in multiple configurations according to various examples. Additionally, the components of system 1300 can be included within a single device, or can be distributed between two manufacturing device 1307, in some examples, processor 1305 can be located within manufacturing device 1307.

Figure 14:
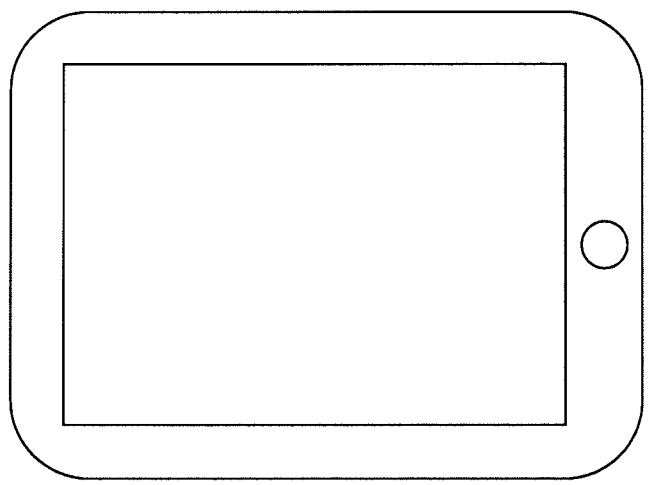

FIG. 14 illustrates an exemplary personal device 1400, such as a tablet, that can include a touch sensor made using a shorting bar according to various examples.

Figure 15:
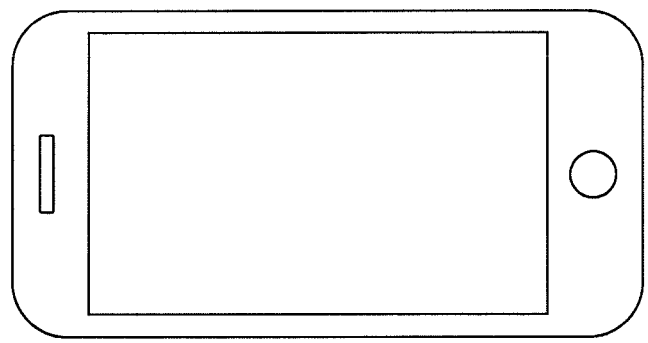
FIGS. 14-17 illustrate exemplary personal devices having a touch sensor manufactured using shorting bars according to various examples.

FIG. 15 illustrates another exemplary personal device 1500, such as a mobile phone, that can include a touch sensor made using a shorting bar according to various examples.

Figure 16:
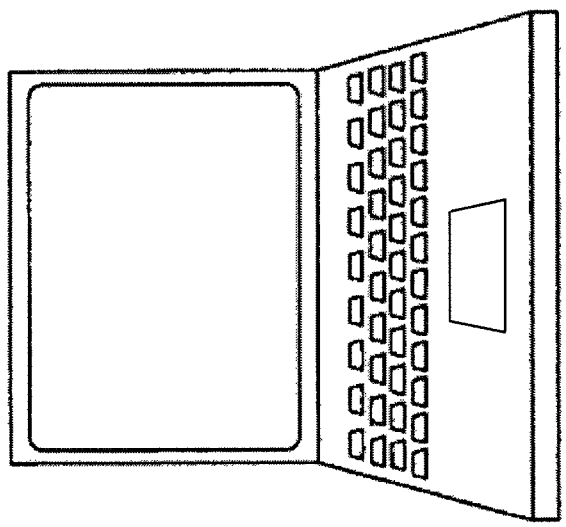

FIG. 16 illustrates an exemplary personal device 1600, such as a laptop having a touchpad, that can include a touch sensor made using a shorting bar according to various examples.

Figure 17:
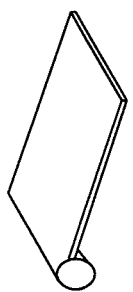

FIG. 17 illustrates another exemplary personal device 1700, such as a touch pad, that can include a touch sensor made using a shorting bar according to various examples.

Therefore, according to the above, some examples of the disclosure are directed to a method comprising: forming a plurality of touch sensors on a sheet of base film, wherein each of the plurality of touch sensors comprises a bond pad; for each of the plurality of touch sensors, forming a shorting bar coupling together two or more contacts of the bond pad; and removing each of the plurality of touch sensors from the sheet of base film, wherein after removing, each touch sensor is separated from its corresponding shorting bar. Additionally or alternatively to one or more of the examples disclosed above, the sheet of base film can comprises cyclo olefin polymer. Additionally or alternatively to one or more of the examples disclosed above, removing each of the plurality of touch sensors from the sheet of base film can be performed using a die cut process. Additionally or alternatively to one or more of the examples disclosed above, removing each of the plurality of touch sensors from the sheet of base film can be performed using a laser cut process. Additionally or alternatively to one or more of the examples disclosed above, removing each of the plurality of touch sensors from the sheet of base film can be performed using lithography. Additionally or alternatively to one or more of the examples disclosed above, the bond pad for each of the plurality of touch sensors can extend beyond an edge of the corresponding touch sensor.

Some examples of the disclosure are directed to a method comprising: forming a touch sensor on a base film, the touch sensor defining a device area on the base film, wherein forming the touch sensor comprises: forming a plurality of sense lines on the base film; forming a plurality of drive lines on the base film; forming one or more bond pads on the base film; and forming a plurality of conductive traces that couple together the one or more bond pads with the plurality of sense lines and the plurality of drive lines; and forming one or more shorting bars coupled to the one or more bond pads, wherein the one or more shorting bars are formed outside the device area of the base film. Additionally or alternatively to one or more of the examples disclosed above, a portion of each of the one or more bond pads can be formed outside the device area of the base film. Additionally or alternatively to one or more of the examples disclosed above, the one or more bond pads can comprise a plurality of bond pads, the one or more shorting bars can comprise one shorting bar, and the one shorting bar can couple together all contacts of the plurality of bond pads. Additionally or alternatively to one or more of the examples disclosed above, the one or more bond pads can comprise a first bond pad coupled to the plurality of drive lines and a second bond pad coupled to the plurality of sense lines, and the one or more shorting bars can comprise a first shorting bar coupling together contacts of the first bond pad and a second shorting bar coupling together contacts of the second bond pad. Additionally or alternatively to one or more of the examples disclosed above, the one or more bond pads can comprise a first plurality of bond pads coupled to the plurality of drive lines and a second plurality of bond pads coupled to the plurality of sense lines, and the one or more shorting bars can comprise a first shorting bar coupling together contacts of the first plurality of bond pads and a second shorting bar coupling together contacts of the second plurality of bond pads.

Some examples of the disclosure are directed to a method for manufacturing a touch sensor, the method comprising: depositing a first mask layer on a base film, wherein the base film comprises a layer of indium tin oxide and a layer of copper; removing a portion of the first mask to define a plurality of drive lines, a plurality of sense lines, a plurality of bond pads, a plurality of conductive traces coupling together the plurality of sense lines and the plurality of drive lines with the plurality of bond pads, and one or more shorting bars coupled to the plurality of bond pads; etching, using the first mask layer, a first portion of the layer of copper and a first portion of the layer of indium tin oxide to form the plurality of drive lines, the plurality of sense lines, the plurality of bond pads, the plurality of conductive traces, and the one or more shorting bars; removing the first mask layer; depositing a second mask layer on the base film over the plurality of conductive traces, the plurality of bond pads, and the one or more shorting bars; etching, using the second mask, a second portion of the layer of copper located above the plurality of drive lines and the plurality of sense lines;

removing the second mask layer; and removing the touch sensor from the base film, wherein after removing the touch sensor from the base film, the one or more shorting bars are separated from the touch sensor. Additionally or alternatively to one or more of the examples disclosed above, removing the touch sensor from the base film can comprise cutting the touch sensor along a line intersecting the plurality of bond pads. Additionally or alternatively to one or more of the examples disclosed above, the plurality of bond pads can comprise: a first bond pad coupled to a first end of the plurality of drive lines; a second bond pad coupled a second end of the plurality of drive lines; a third bond pad coupled to a first end of the plurality of sense lines; and a fourth bond pad coupled to a second end of the plurality of sense lines. Additionally or alternatively to one or more of the examples disclosed above, the one or more shorting bars can comprise: a first shorting bar coupled to the first bond pad; a second shorting bar coupled to the second bond pad; a third shorting bar coupled to the third bond pad; and a fourth shorting bar coupled to the fourth bond pad. Additionally or alternatively to one or more of the examples disclosed above, the method can further comprise, before removing the touch sensor from the base film: measuring an impedance of the plurality of drive lines using the first shorting bar and the second shorting bar; and measuring an impedance of the plurality of sense lines using the third shorting bar and the fourth shorting bar.

Some examples of the disclosure are directed to a touch sensor comprising: a plurality of sense lines; a plurality of drive lines; one or more bond pads; and a plurality of conductive traces that couple together the one or more bond pads with the plurality of sense lines and the plurality of drive lines, wherein the one or more bond pads extend to an edge of the touch sensor. Additionally or alternatively to one or more of the examples disclosed above, the one or more bond pads can comprise indium tin oxide. Additionally or alternatively to one or more of the examples disclosed above, the one or more bond pads can comprise copper. Additionally or alternatively to one or more of the examples disclosed above, the touch sensor can be incorporated within one of a phone, portable media player, tablet computing device, or touch pad. Additionally or alternatively to one or more of the examples disclosed above, the one or more bond pads can have been separated from a shorting bar.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the appended claims.

What is claimed is:

1. A method comprising:
    forming a touch sensor on a sheet of base film, the touch sensor comprising one or more bond pads including a first bond pad and a second bond pad formed on the base film, said first and second bond pads connecting to conductive traces at a first side of the touch sensor;
    forming a first shorting bar coupling together two or more contacts of the first bond pad at the first side of the touch sensor;
    forming a second shorting bar coupling together two or more contacts of the second bond pad at the first side of the touch sensor, wherein the second shorting bar is disconnected from the first shorting bar while the first shorting bar is coupling together two or more contacts of the first bond pad and the second shorting bar is coupling together two or more contacts of the second bond pad; and
    removing the touch sensor from the sheet of base film; and thereafter separating, the touch sensor from the first shorting bar and the second shorting bar.

2. The method of claim 1, wherein the sheet of base film comprises cyclo olefin polymer.

3. The method of claim 1, wherein removing the touch sensor from the sheet of base film is performed using a die cut process.

4. The method of claim 1, wherein removing the touch sensor from the sheet of base film is performed using a laser cut process.

5. The method of claim 1, wherein removing the touch sensor from the sheet of base film is performed using lithography.

6. The method of claim 1, wherein the first bond pad for the touch sensor extends beyond an edge of the corresponding touch sensor.

7. The method of claim 1, wherein the first shorting bar couples together all contacts of the first bond pad.

8. The method of claim 1, wherein removing the touch sensor from the base film comprises cutting the one or more bond pads along a line intersecting the first and second bond pads.

9. The method of claim 1, wherein the first bond pad is coupled to a plurality of drive lines, and the second bond pad is coupled to a plurality of sense lines.

10. The method of claim 9, the touch sensor further comprising a third bond pad and a fourth bond pad, wherein:
    the first bond pad is coupled to a first end of the plurality of drive lines;
    the second bond pad is coupled to a first end of the plurality of sense lines;
    the third bond pad is coupled to a second end of the plurality of drive lines; and
    the fourth bond pad is coupled to a second end of the plurality of sense lines.

11. The method of claim 10, the touch sensor further comprising a third shorting bar and a fourth shorting bar, wherein:
    the third shorting bar is coupled to the third bond pad; and
    the fourth shorting bar is coupled to the fourth bond pad.

12. The method of claim 11, wherein the method further comprises, before removing the touch sensor from the base film:
    measuring an impedance of the plurality of drive lines using the first shorting bar and the third shorting bar; and
    measuring an impedance of the plurality of sense lines using the second shorting bar and the fourth shorting bar.

* * * * *